Figure 4:
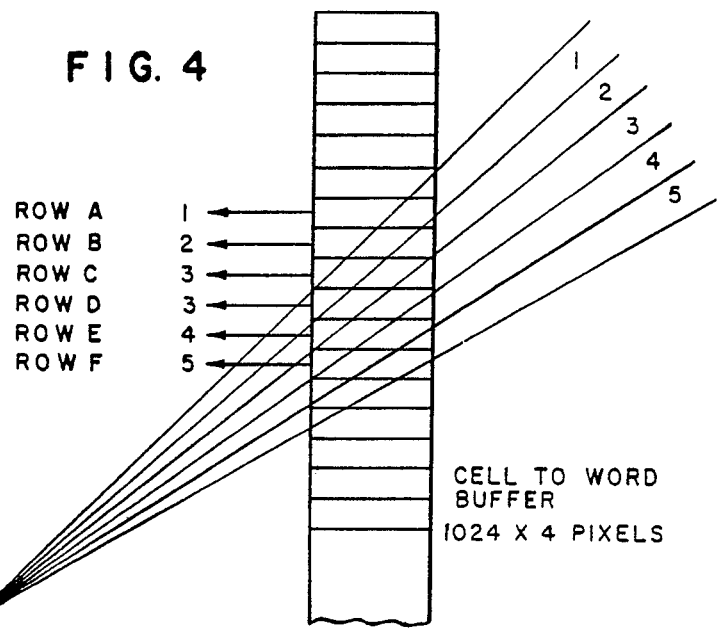

United States Patent [19]

Thomas et al.

[11] Patent Number: 4,568,941
[45] Date of Patent: Feb. 4, 1986

[54] CELL TO WORD BUFFER

[75] Inventors: David M. Thomas, Ottawa; Leonard J. Tubb, Kanata; Jean C. Castonguay, Nepean, all of Canada

[73] Assignee: Her Majesty the Queen in right of Canada as represented by the Minister of National Defence, Ottawa, Canada

[21] Appl. No.: 393,334

[22] Filed: Jun. 29, 1982

[30] Foreign Application Priority Data

Dec. 21, 1981 [CA] Canada ................................ 392799

[51] Int. Cl.$^4$ ........................... G01S 7/04; H04N 7/01
[52] U.S. Cl. ................................ 343/5 SC; 358/140; 364/731
[58] Field of Search ............... 343/5 SC, 5 DP; 358/140; 340/347 DD; 364/731

[56] References Cited

U.S. PATENT DOCUMENTS

| | | | |
|---|---|---|---|
| 3,810,174 | 5/1974 | Heard et al. | 343/5 SC X |
| 3,964,064 | 6/1976 | Brandao et al. | 343/5 SC |
| 4,128,838 | 12/1978 | Brands et al. | 343/5 SC |
| 4,232,376 | 11/1980 | Dion et al. | 358/140 X |

FOREIGN PATENT DOCUMENTS

| | | | |
|---|---|---|---|
| 0173774 | 10/1982 | Japan | 343/5 DP |
| 0173775 | 10/1982 | Japan | 343/5 DP |

Primary Examiner—T. H. Tubbesing
Assistant Examiner—Gilberto Barrón, Jr.
Attorney, Agent, or Firm—Stevens, Davis, Miller & Mosher

[57] ABSTRACT

Disclosed is a cell to word buffer for use in a digital TV display radar system in which radar pulse returns are digitized by an analog to digital converter to form pixel data, polar coordinates of the pulse returns are converted to their equivalent X, Y cartesian coordinates by a coordinate converter and the pixel data are stored in an X, Y refresh memory array in accordance with their X, Y coordinates for use in refreshing a TV display. The cell to word buffer allows large offsets in high resolution radar scan converters. The cell to word buffer memory means is located intermediate the coordinate converter and refresh memory for temporarily storing, for each Y location, a plurality of groups of adjacent pixel data and their associated X addresses and for transferring each group of pixel data to its appropriate location in the refresh memory when each group in the buffer memory is filled with pixel data. Further buffer registers of the first in, first out type may be provided intermediate the buffer memory and the refresh memory for smoothing the rate of data transfers therebetween. Also, peak detection means may be provided to avoid loss of pixel data for radar samples near the origin.

8 Claims, 6 Drawing Figures

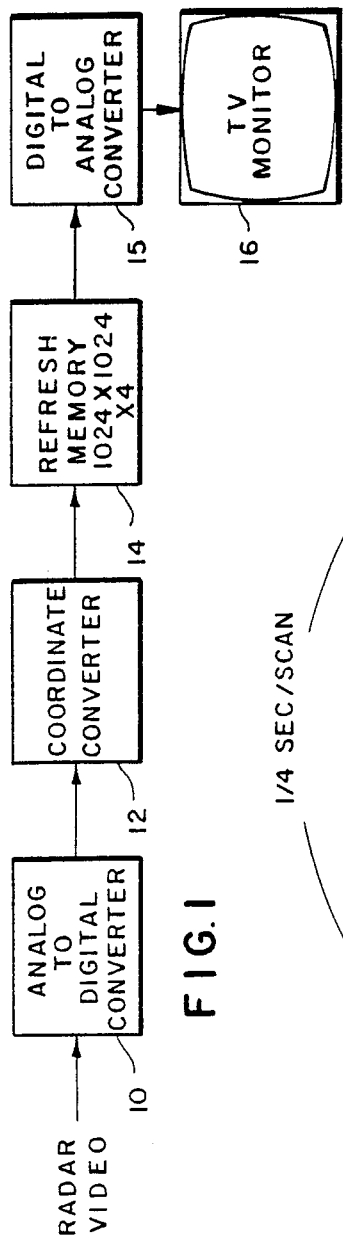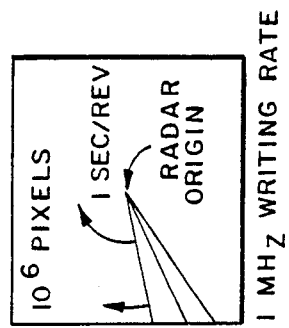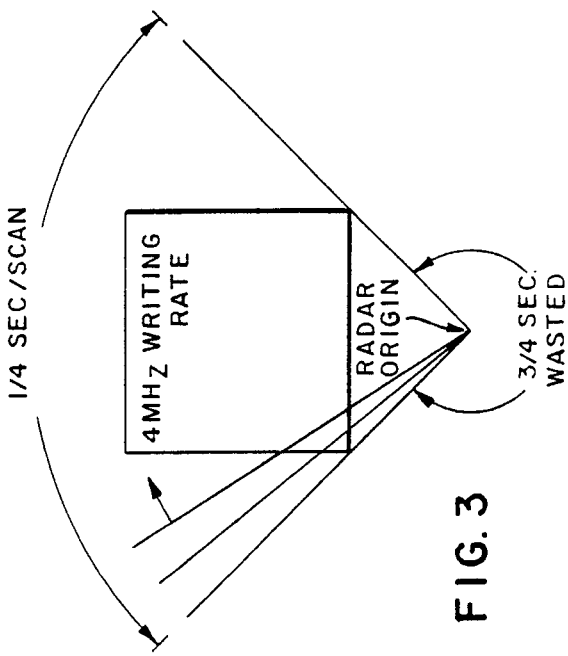

CELL TO WORD BUFFER

This invention relates to a cell to word buffer for use in high resolution radar scan converters.

In a digital scan converter, radar video signals are quantized by an analogue to digital converter. The quantized samples are written into a large digital memory, organized in an X, Y addressing scheme by coordinate conversion logic which converts the polar coordinate system of the radar into the cartesian coordinate system of the memory. The memory is then scanned at 60 Hz to refresh a TV monitor.

For a high quality, good definition display, the TV resolution must be high, in the order of 1000 lines per scan. For a 1:1 aspect ratio, each line must contain 1000 samples or picture elements (pixels). The total memory is therefore one million pixels. This memory is scanned at 60 Hz on a 2:1 interlace basis to refresh the TV. The pixel read out rate on the memory is therefore at least 30 MHz not taking into account time lost for horizontal and vertical blanking of the TV.

With present day technology, the memory is built up from dynamic MOS integrated circuit chips. Memory densities of 16,384 bits per chip are now available. The read/write cycle time of these devices are only of the order of 2 MHz. Therefore, to obtain the high pixel read out rate, the memory is organized such that many such devices are read in parallel in the X direction, leaving some band width left for input.

A similar problem exists on the input to the memory, however. In one scan of the radar antenna through the selected display field of view, each pixel location must be loaded with the appropriate sample. For a 60 RPM radar with the origin located in the center of the display field of view, the million pixels must be loaded in one second. The average input bandwidth to the memory is therefore 1 MHz.

In this example, reading 30 memory chips in parallel supplies a 30 MHz output rate, while only using one half of the individual chip's speed capability. The random input writing rate of one MHz can therefore barely be achieved with no margin.

The problem becomes very much worse when the radar is offset such that the origin is outside the display field of view. In this case the antenna scans through the million pixels in less times than the total rotation period. In this example, if the offset is to the bottom of the display, the average input writing rate is 2 MHz. For a one diameter offset, the rate is 4 MHz, and so on.

A basic problem is therefore how to obtain more effective input memory bandwidth to allow reasonable radar offset.

There are various known ways of combatting the problem and, in a practical situation, a combination of different approaches may be necessary.

Increased input bandwidth may be obtained by splitting the memory into a number of pages. Each page has its own controller such that data may be written into all pages in parallel, thereby increasing the input bandwidth by a factor equal to the number of pages.

The limitation on the number of pages that can be implemented is the cost of individual memory controllers and the pin-out limitations of the memory circuit cards. In a typical example, the 1024×1024 pixel memory can be implemented with four circuit cards each containing 64 16K RAMS (4 bits/pixel). A logical organization is to split this into four pages, with one page per card. This supplies an effective increase of memory bandwidth of four times.

Use can be made of the complete scan time of the radar if the sampled data is stored in a B-scan buffer prior to coordinate conversion. A double buffer is required, one for writing into while the other is being read. Even with a single buffer, the memory requirements are very large, however. In order to retain full radar resolution, data must be stored for each radar pulse. For a 60 RPM, 4 kHz radar one-half scan (180°) therefore produces $\frac{1}{2} \times 4000 \times 1 = 2000$ radar pulses. Each radar pulse represents approximately one thousand pixels. A total of two million pixels must therefore be stored in a single buffer. This is twice the storage requirements of the display memory itself. The reason that the display memory is smaller is that during the coordinate conversion, many pixels near the origin map into the same memory location, whereas for the B-scan buffer, a unique location is required for each radar sample.

The B-scan buffer approach is therefore very expensive, and is not feasible for use with high pulse repetition frequency, high resolution radars.

The present invention overcomes the bandwidth limitations of high density digital memories when used in a digital high resolution TV display radar scan converter. As mentioned above, high bandwidths are needed when the radar origin is offset outside the field of view of the display. The present invention makes use of the fact that to provide the speed necessary to raster scan the complete TV refresh memory at 30 Hz, it is organized such that a large number of individual memory components are addressed in parallel. To take advantage of the resulting wide bandwidth in X to solve what is effectively a wide bandwidth random access requirement, a small, very fast buffer is inserted between the TV refresh memory and the source of the digitized radar samples. These samples and their associated addresses are stored in this fast buffer until a group of them destined for adjacent X locations in the refresh memory are available. This group is then written into the refresh memory at the fast addressing rate resulting from the raster organization of this memory. The effective writing rate into the memory is therefore increased by a factor equal to the number of samples in the group.

Thus, in accordance with the invention there is provided, in a digital TV display system in which radar pulse returns are digitized by an analog to digital converter to form pixel data, polar coordinates of the pulse returns are converted to their equivalent X, Y cartesian coordinates by a coordinate converter and the pixel data are stored in an X, Y refresh memory array in accordance with their X, Y coordinates for use in refreshing a TV display, the improvement comprising cell to word buffer memory means intermediate the coordinate converter and refresh memory for temporarily storing, for each Y location, a plurality of groups of adjacent pixel data and their associated X addresses and for transferring each group of pixel data to its appropriate location in the refresh memory when each group in the buffer memory means is filled with pixel data.

Figure 5:
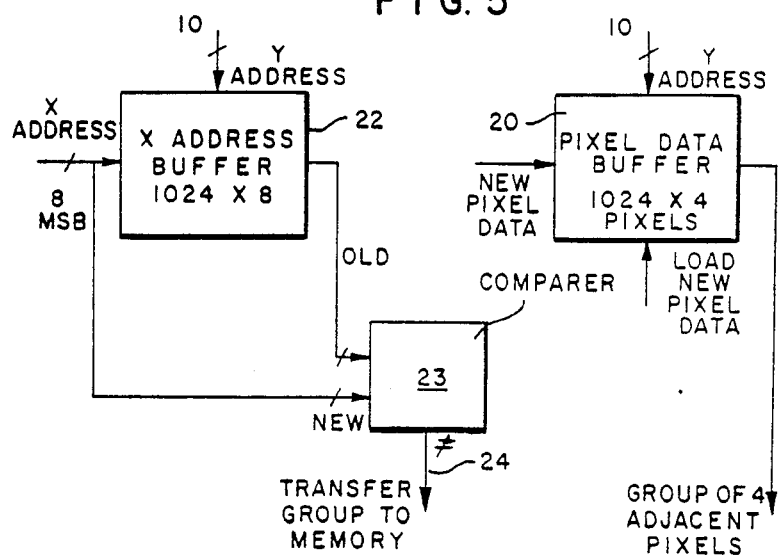
Figure 6:
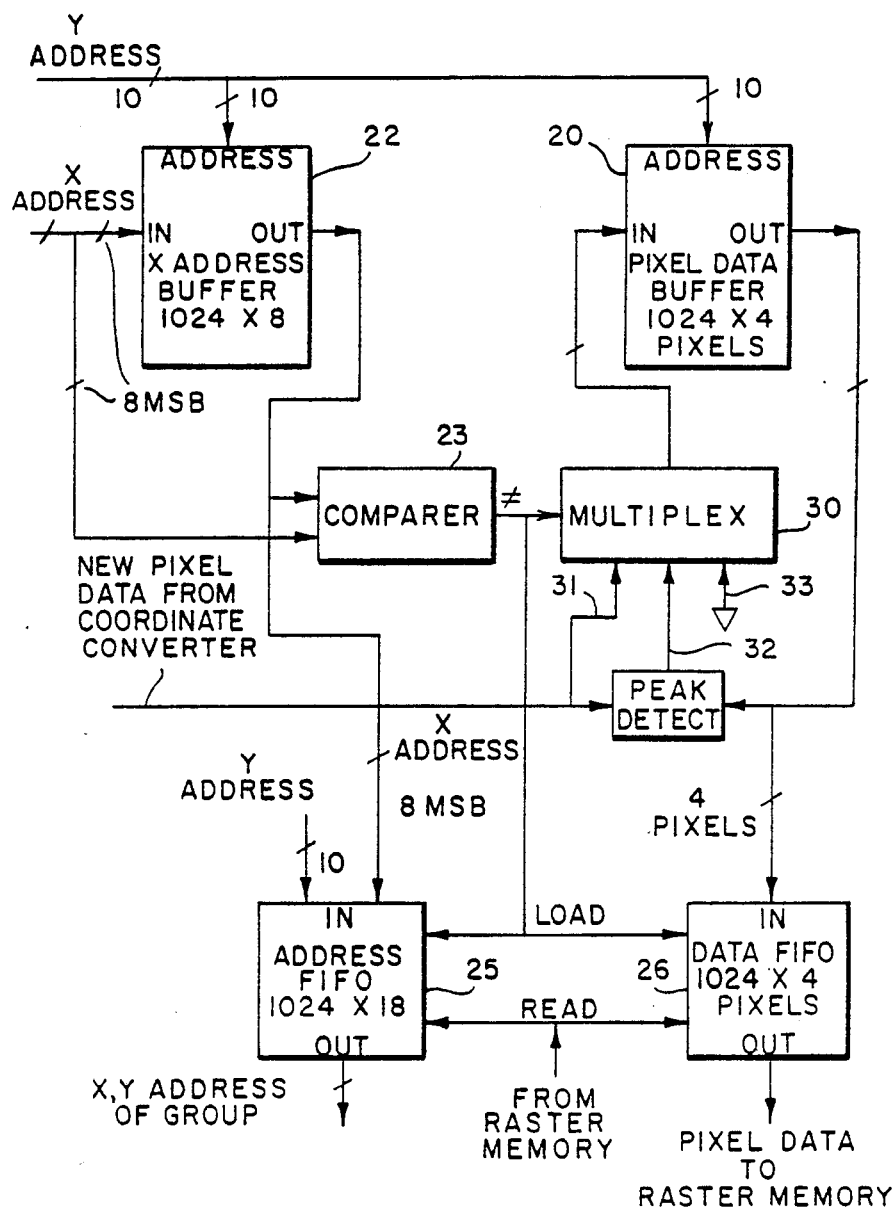

The invention will not be further described in conjunction with the accompanying drawings, in which:

FIG. 1 is a block diagram of a radar scan converter,

FIG. 2 is a diagram illustrating a display with the radar origin at the center of the display, FIG. 3 illustrates a display where the radar is offset by one diameter, FIG. 4 is a diagram useful for explaining group transfer of data from a buffer, FIG. 5 is a block diagram illustrating the basic concept of a cell to word buffer according to the invention, FIG. 6 is a detailed block diagram of the cell to word buffer according to the invention.

The functional block diagram of a digital radar scan converter is shown in FIG. 1. Radar video signals (pulse echo returns) are quantized by an analog to digital converter 10. These quantized samples are written into a large digital memory 14, organized in an X, Y addressing scheme, by the coordinate converter 12 which converts the polar coordinate system of the radar into the cartesian coordinate system of the refresh memory. The refresh memory is then scanned at 60 Hz, converted to analog signals by digital to analog converter 15 and used to refresh the display on TV monitor 16.

As mentioned previously, the TV monitor 16 should have high resolution, in the order of one thousand lines, each line containing one thousand pixels for a total of one million pixels.

Referring to FIG. 2, in one scan of the radar antenna through the selected display field of view, each pixel location must be loaded with the appropriate sample. For a 60 rpm radar with the origin located in the center of the display field of view as shown in FIG. 2, the million pixels must be loaded in one second. The average input bandwidth to the memory is therefore 1 MHz.

The problem becomes very much worse when the radar is offset such that the origin is outside the display field of view. In this case the antenna scans through the million pixels in less time than the total rotation. For a one diameter offset to the bottom of the display, as illustrated in FIG. 3, the average input writing rate is 4 MHz.

The present invention provides a simple way of obtaining increased memory bandwidth by making use of the fact that for TV refresh purposes, the memory is organized with a very wide bandwidth in X by parallel addressing of a number of individual memory chips. The cell to word buffer techniques stores a small amount of the radar samples in a fast memory, organized such that when a group of samples with adjacent X addresses have been accumulated, this group is transferred to the refresh memory in a block. Provided these transfers are spread evenly through the available time, the effective input bandwidth is increased by the group size.

This is illustrated in FIG. 4. In this example, the cell to word buffer is 1024 rows, each of four samples. Five radar pulses are shown, numbered one to five. As the radar antenna rotates, the rows of the buffer are filled up. The last location in row A is filled by pulse echo returns from radar pulse 1, at which time the complete row or group of 4 pixels is transferred to the refresh memory. Similarly, row B is filled by echos occurring during the pulse 2 and transferred at that time. The third pulse fills rows C and D sequentially and therefore these rows are transferred at the full sample generation rate. A second small buffer may be provided to smooth out the rate of data transfers.

FIG. 5 shows conceptually, in block diagram form, how the data is stored in the cell to word buffer with its corresponding X and Y addresses supplied by the coordinate converter. Two buffers are required, a first buffer 20 for storing the pixel data and a second buffer 22 for storing the X address. Both buffers 20 and 22 are addressed by the same Y address. In this example, the group size is four, and the pixel data buffer is therefore 1024×4 pixels. Because transfers to the refresh memory (not shown in FIG. 5) are in groups of four, only the eight most significant bits of the ten-bit X address are stored in the X address buffer 22 which is also 1024 rows deep.

Each new sample (pixel data) is stored in the pixel data buffer 20 at its associated Y location. The eight most significant bits of the X address of this sample are stored in the X address buffer at the same Y location. Before storing, the new truncated X address is compared at 23 with the present contents of the same location in the X address buffer 22. If they are the same value it means that the new pixel data is part of the present group being accumulated at that Y address and the pixel data is therefore stored. If they are different, however, comparer 23 signals this occurrence on line 24 which indicates that the corresponding pixel data is the first sample of the next group (of four). The contents of the group are therefore transferred to the refresh memory together with the associated X and Y addresses before the new pixel data is loaded into the pixel data buffer at the next X address.

A detailed block diagram of the cell to word buffer is shown in FIG. 6. This Figure includes two additional features. These are the additional buffer means between the cell to word buffer proper and the refresh memory, and some peak detect and multiplexing logic on the input to the pixel data buffer 20.

The X and Y addresses to the buffers 20 and 22 are obtained from the coordinate converter (item 12 in FIG. 1). As before, a comparer 23 is provided to compare the new truncated X addresses with the present contents of the same location in the X address buffer.

The additional buffers are two first-in, first-out registers (FIFOS) 25 and 26. These FIFOS buffer the group pixel data and their associated X, Y addresses. This ensures that the transfers from the cell to word buffer to the refresh memory (raster memory) are smoothed out such that the cell to word buffer memory is continually busy as opposed to being idle for a period, followed by a burst of activity that exceeds its input writing rate. This situation is most prevalent when the radar is pointing North or South. In this case, the last location of adjacent groups are filled at almost the full rate of the coordinate converter, which exceeds the input rate of the memory. For worst case radar conditions, 1024 words are adequate for this purpose.

The peak detect logic is an additional feature of this system which solves the problem of collapsing loss of the radar. Collapsing loss concerns the fact that, near the origin, many radar samples map to the same pixel location. To avoid losing point targets, these samples are peak detected. The cell to word buffer offers a simple way of doing this without complicating the writing into the refresh memory. The new pixel sample is applied to a four-pixel multiplexer 30 over line 31 along with latched pixel data output from the pixel data buffer over line 32 and logic "zero" over line 33. For each successive change of X address, one of these three inputs are stored in the pixel data buffer 20 at the specified Y address. The decision as to which is stored is made by the peak detect comparator according to the following:

(a) If $\overline{\text{COMPARE VALID}}$ and new data less then previous data, reload previous data in all four pixels.

(b) If $\overline{\text{COMPARE VALID}}$ and new data greater than previous data, load new data in pixel location concerned and reload previous data in other three pixels.

(c) If COMPARE VALID, load data in pixel location concerned and load zeros in other three pixels.

The present invention offers the following advantages:

(a) The increased bandwidth of the refresh memory necessary to achieve radar offset is provided with a relatively small amount of hardware compared with alternative methods. With four pixels per group, all the hardware can be packaged on a single 9 inch by 9 inch circuit card.

(b) The bandwidth can be increased to any desired amount from the example shown by increasing the size of the pixel data buffer at relatively low incremental cost.

(c) Peak detection required to avoid radar collapsing loss is implemented very simply.

The embodiments of the invention in which an exclusive property or privilege is claimed are defined as follows:

1. In a digital TV display radar system in which radar pulse returns are digitized by an analog to digital converter to form pixel data, polar coordinates of the pulse returns are converted to their equivalent X, Y cartesian coordinates by a coordinate converter and the pixel data are stored in an X, Y refresh memory array in accordance with their X, Y coordinates for use in refreshing a TV display, the improvement comprising cell to word buffer memory means intermediate the coordinate converter and refresh memory for temporarily storing, for each Y location, a plurality of groups of adjacent pixel data and their associated X addresses and for transferring each group of pixel data to its appropriate location in the refresh memory when each group in the buffer memory means is filled with pixel data.

2. The improvement claimed in claim 1 wherein said buffer memory means comprises a first buffer memory for storing pixel data and a second buffer memory for storing X addresses.

3. The improvement as claimed in claim 2 further comprising means for addressing said first and second buffer memories by the same Y address.

4. The improvement as claimed in claim 3 wherein the refresh memory has 1024×1024 memory locations and the first and second buffer memories each have 1024 memory locations.

5. The improvement as claimed in claim 4 wherein each memory location in the first memory buffer comprises means for storing data for four pixels.

6. The improvement as claimed in claim 5 including means for comparing the X address of new pixel data with the X address already stored in said second buffer memory for each Y address whereby, if the X addresses agree, the new pixel data is stored at that Y address whereas, if the X addresses differ, the group of pixel data stored at that Y address is transferred to the refresh memory together with associated X and Y addresses and the new pixel data is stored at the next Y address in the buffer memory means.

7. The improvement as claimed in claim 6 and further comprising first and second FIFO (First-In, First-Out) buffer registers intermediate the first and second buffer memories and the refresh memory, for smoothing the rate of data transfers between the buffer memory and the refresh memory.

8. The improvement as claimed in claim 7 including peak detection means to avoid loss of pixel data for radar samples near the origin.

* * * * *